(12) United States Patent
Kiyose et al.

(10) Patent No.: US 10,226,959 B2
(45) Date of Patent: Mar. 12, 2019

(54) SUBSTRATE PROCESSING APPARATUS

(75) Inventors: Hiromi Kiyose, Neyagawa (JP); Satoru Hiraki, Neyagawa (JP); Hiroshi Watanabe, Atsugi (JP)

(73) Assignees: Kurashiki Boseki Kabushiki Kaisha, Kurashiki (JP); Chemical Art Technology, Inc., Atsugi (JP)

( * ) Notice: Subject to any disclaimer, the term of this patent is extended or adjusted under 35 U.S.C. 154(b) by 99 days.

(21) Appl. No.: 13/811,877

(22) PCT Filed: Jul. 21, 2011

(86) PCT No.: PCT/JP2011/066599
§ 371 (c)(1),
(2), (4) Date: May 31, 2013

(87) PCT Pub. No.: WO2012/011535
PCT Pub. Date: Jan. 26, 2012

(65) Prior Publication Data
US 2013/0240143 A1  Sep. 19, 2013

(30) Foreign Application Priority Data

Jul. 23, 2010 (JP) ................................ 2010-166288

(51) Int. Cl.
*B44C 1/22* (2006.01)
*H01L 21/67* (2006.01)
*H01L 21/311* (2006.01)

(52) U.S. Cl.
CPC ........ *B44C 1/227* (2013.01); *H01L 21/31111* (2013.01); *H01L 21/67057* (2013.01); *H01L 21/67086* (2013.01); *H01L 21/67109* (2013.01)

(58) Field of Classification Search
CPC ............... B44C 1/227; H01L 21/31111; H01L 21/67109; H01L 21/67057; H01L 21/67086
(Continued)

(56) References Cited

U.S. PATENT DOCUMENTS 5,227,986 A * 7/1993 Yokota ...................... G01J 3/28
250/339.07
2002/0084416 A1* 7/2002 Kiuchi ............... G01N 21/3577
250/339.12
(Continued)

FOREIGN PATENT DOCUMENTS

JP  03-209149 A  9/1991
JP  06-011442 A  1/1994
(Continued)

OTHER PUBLICATIONS

Office Action dated Jan. 7, 2015 in corresponding CN Application No. 201180036016.2.
(Continued)

*Primary Examiner* — Gordon Bladwin
*Assistant Examiner* — Mirza Israr Javed
(74) *Attorney, Agent, or Firm* — Knobbe, Martens, Olson & Bear, LLP

(57) ABSTRACT

A substrate processing device, which processes by immersing the substrate in the processing liquid comprising a mixture of a chemical and a diluting liquid, is provided with: a processing tank (1) that retains the processing liquid; heating means (2, 3) that heat the processing liquid; a temperature detection means (4) that detects the temperature of the processing liquid; a temperature control means (5) that operates the aforementioned heating means (2, 3) in a manner so that the detected temperature approaches a set temperature; a replenishing means (6) that replenishes the
(Continued)

diluting liquid in the processing liquid; a concentration detection means (7) that detects the concentration of the processing liquid by measuring the light absorption characteristics of the processing liquid; and a concentration control means (8) that operates the aforementioned replenishing means (6) in a manner so that the detected concentration approaches a set concentration.

4 Claims, 5 Drawing Sheets

(58) Field of Classification Search
USPC .................................................. 156/345.15
See application file for complete search history.

(56) References Cited

U.S. PATENT DOCUMENTS

| | | | |
|---|---|---|---|
| 2004/0140365 A1* | 7/2004 | Izuta | H01L 21/67248 237/12 |
| 2004/0157452 A1* | 8/2004 | Ogawa | H01L 21/31111 438/691 |
| 2005/0067101 A1* | 3/2005 | Funabashi | H01L 21/31111 156/345.18 |
| 2006/0024213 A1* | 2/2006 | Arai | H01L 21/67126 422/129 |
| 2006/0028633 A1* | 2/2006 | Takami | G03F 7/70891 355/67 |
| 2007/0248127 A1* | 10/2007 | Shiraishi | G02B 7/008 372/36 |
| 2008/0066863 A1* | 3/2008 | Kiyose | H01L 21/31111 156/345.15 |
| 2008/0308530 A1 | 12/2008 | Izuta | |
| 2009/0081881 A1* | 3/2009 | Kiyose | H01L 21/67086 438/753 |
| 2011/0315228 A1* | 12/2011 | Yokota | B01F 5/0644 137/1 |
| 2013/0048215 A1* | 2/2013 | Higashi | H01L 21/67086 156/345.15 |

FOREIGN PATENT DOCUMENTS

| | | | | |
|---|---|---|---|---|
| JP | 06-265471 A | | 9/1994 | |
| JP | 11-200072 A | | 7/1999 | |
| JP | 2000-088749 A | | 3/2000 | |
| JP | 2002-334865 A | | 11/2002 | |
| JP | 2004-221540 A | | 8/2004 | |
| JP | 2005-072251 | * | 3/2005 | |
| JP | 2005-072251 A | | 3/2005 | |
| JP | 2005072251 A | * | 3/2005 | ........... H01L 21/306 |
| JP | 2005-187844 | * | 7/2005 | |
| JP | 2005-187844 A | | 7/2005 | |
| JP | 2005187844 A | * | 7/2005 | ................ C23F 1/46 |

OTHER PUBLICATIONS

Korean Office Action issued Dec. 13, 2013, in corresponding Korean Application No. 10-2013-7002912.
Taiwanese Office Action dated Jul. 17, 2015 for Application No. 100126029.

* cited by examiner

SUBSTRATE PROCESSING APPARATUS

CROSS-REFERENCE TO RELATED APPLICATIONS

This application is the U.S. National Phase under 35. U.S.C. § 371 of International Application PCT/JP2011/066599, filed Jul. 21, 2011, which claims priority to Japanese Patent Application No. 2010-166288, filed Jul. 23, 2010. The International Application was published under PCT Article 21(2) in a language other than English.

TECHNICAL FIELD

The present invention relates to a substrate processing apparatus that performs processing of a substrate such as a semiconductor wafer, a glass substrate for a liquid crystal display device, or a glass substrate for a photomask (hereafter simply referred to as "substrate") with a processing liquid and, in particular, is useful as a technique of performing concentration control while detecting the concentration of the processing liquid at a high precision when immersing and processing the substrate in the processing liquid that has been heated to a high temperature.

DESCRIPTION OF THE RELATED ART

Conventionally, as a substrate processing apparatus of this kind, there is known, for example, a substrate processing apparatus that performs an etching treatment of a silicon nitride film (SiN) on a substrate surface using a high-temperature solution of phosphoric acid ($H_3PO_4$).

For example, in the case of etching a silicon nitride film with a phosphoric acid solution in a semiconductor wafer process, it is general that a silicon oxide film ($SiO_2$) is present on the substrate surface in addition to the silicon nitride film. In such a case, the object of etching is only the silicon nitride film, and it is generally demanded that the silicon oxide film is hardly etched by the processing liquid.

As a mechanism by which the silicon nitride film and the silicon oxide film are etched with a phosphoric acid solution, it is known that the silicon nitride film is etched by water in the phosphoric acid solution, and the silicon oxide film is etched by phosphoric acid in the phosphoric acid solution.

For this reason, in order to manage the etching amount of the silicon nitride film with a good precision, the concentration of the processing liquid, that is, the ratio of mixing a chemical agent liquid with a diluent, and the temperature of the processing liquid are extremely important. Also, generally, in a phosphoric acid solution at a high temperature, the amount of evaporation of water which is the diluent is large, so that concentration control by replenishment with water is important. As a substrate processing apparatus equipped with means for holding the temperature or concentration of the processing liquid to be constant, apparatus disclosed in the following Patent Documents 1 and 2 are known.

For example, in the Patent Document 1, there is disclosed a substrate processing apparatus that performs automatic control of the replenishment rate of water in accordance with a result of comparison between the current temperature and the boiling temperature of a phosphoric acid bath which is used as a set temperature in performing concentration control of the phosphoric acid bath by replenishment with water. In this apparatus, what is actually controlled is only the temperature of the processing liquid, and this is means for replenishment with the diluent that is dependent on the physical phenomenon that the concentration of the processing liquid does not become the boiling concentration or below.

Also, Patent Document 2 discloses a substrate processing apparatus provided with temperature control means that operates the heating means so as to make the temperature of the processing liquid be a set temperature, replenishing means that replenishes the processing tank with the diluent so as to adjust the concentration of the processing liquid, concentration detection means that detects the concentration of the processing liquid by the specific weight of the processing liquid or the like, and concentration control means that adjusts the amount of replenishment with the diluent in a manner so that the detected concentration of the processing liquid will be a little higher than the boiling point temperature.

PRIOR ART DOCUMENTS

Patent Documents

Patent Document 1: JP-A-11-200072
Patent Document 2: JP-A-2004-221540

SUMMARY OF THE INVENTION

Problems to be Solved by the Invention

However, in the case of the apparatus disclosed in Patent Document 1, the phosphoric acid bath concentration corresponding to the boiling temperature of the phosphoric acid bath is constant, so that, when the etching amount of the silicon nitride film is determined, the concentration and the temperature of the processing liquid are determined at the same time, thereby raising a problem in that each cannot be independently adjusted. Also, the amount of replenishment with the diluent must be a little larger than the inherent amount of evaporation; however, when the amount of replenishment becomes excessive, it will be a cause of decrease in the temperature of the processing liquid or bumping of the processing liquid. The bumping of the processing liquid raises a problem, for example, of breakage of the wafer in the processing tank.

Also, in the case of the apparatus disclosed in Patent Document 2, the concentration detection means converts the pressure of the gas supplied from the detection end in the processing tank into the specific weight of the processing liquid, so that the pressure of the gas supplied from the detection end changes in accordance with the temperature of the processing liquid, the amount of liquid in the processing tank, and the flow of the processing liquid in the processing tank. Therefore, detection must be carried out under conditions in which the temperature of the processing liquid, the amount of liquid in the processing tank, and the flow in the processing tank are constant. However, in practical use, when the processing liquid is replenished with the diluent in order to control the concentration of the processing liquid, the temperature of the processing liquid also changes, thereby raising a problem in that an accurate concentration cannot be measured until the temperature of the processing liquid returns to a set temperature. Also, the flow of the processing liquid in the processing tank changes by various causes. Therefore, even if there is no concentration fluctuation, the change in the flow of the processing liquid in the processing tank may be regarded as a change in the concentration of the processing liquid, and the replenishment with the diluent may be carried out or stopped to invite a change in the actual concentration of the processing liquid, whereby the etching amount of the silicon nitride film may change.

Furthermore, the prior art techniques disclosed in Patent Documents 1 and 2 both have a problem such as the following. Specifically, both of the prior art techniques can control the concentration of the processing liquid only under conditions such that the temperature of the processing liquid is constant. However, in actual treatment processes, when a semiconductor wafer, for example, is immersed into a processing tank of a high temperature, the temperature of the processing liquid in the processing tank decreases. In such a case, in accordance with the prior art techniques, the concentration of the processing liquid is not known or clear until the temperature of the processing liquid in the processing tank returns to be around the set temperature, so that the concentration control cannot be made, and the replenishment with the diluent must be stopped. As a result of this, the diluent is evaporated, and the concentration of the processing liquid rises, thereby giving rise to a cause of instability in the etching amount of the silicon nitride film.

Thus, an object of the present invention is to provide a substrate processing apparatus that is able to perform independent concentration control mostly without being affected by the temperature of the processing liquid and thus is able to accurately perform chemical processing of a substrate, because the concentration of the processing liquid can be directly detected.

Means for Solving the Problems

The aforementioned object can be achieved by the present invention as described below.

Namely, a substrate processing apparatus of the present invention is a substrate processing apparatus that processes a substrate by heating a processing liquid made of a mixture of a chemical liquid and a diluent and immersing the substrate into this processing liquid, being characterized by comprising:

a processing tank that stores the processing liquid;
heating means that heats the processing liquid;
temperature detection means that detects the temperature of the processing liquid;
temperature control means that operates the heating means in a manner so that the temperature detected by the temperature detection means approaches a set temperature;
replenishing means that replenishes the processing liquid with the diluent;
concentration detection means that detects the concentration of the processing liquid by measuring the light absorption characteristics of the processing liquid; and
concentration control means that operates the replenishing means in a manner so that the concentration detected by the concentration detection means approaches a set concentration.

According to the substrate processing apparatus of the present invention, the concentration detection means directly detects the concentration of the processing liquid by measuring the light absorption characteristics of the processing liquid. Therefore, independent concentration control can be made mostly without being affected by the temperature of the processing liquid. As a result of this, even when the temperature of the processing liquid decreases by immersion of a substrate wafer, for example, replenishment with water for maintaining the concentration of the processing liquid and the stoppage can be carried out and, as a result of this, the etching of the silicon nitride film is stabilized.

Also, according to the present invention, the ratio of mixing the chemical liquid and the diluent can be freely controlled within a range higher than or equal to the boiling point concentration of the chemical liquid. For example, by setting the concentration of the phosphoric acid solution to be higher than the boiling point concentration, the etching amount of the silicon nitride film can be reduced, and the etching amount of the silicon oxide film can be increased. Here, in the prior art, it has been important that only the silicon nitride film is etched while the silicon oxide film simultaneously present on the substrate is not etched. However, in accordance with diversification of semiconductor devices in recent years, a technique of simultaneously etching a silicon nitride film and a silicon oxide film is also needed.

In the above, it is preferable that the concentration detection means detects the concentration from which an error fluctuation caused by the temperature of the processing liquid has been removed, by measuring the light absorption characteristics at a plurality of wavelengths. By this construction, the concentration detection means can accurately detect the concentration of the processing liquid without being affected by the temperature fluctuation of the processing liquid. In other words, by the spectrometry technique using light absorption characteristics, the light absorption characteristics can be obtained for a plurality of different wavelengths. Therefore, the change in the concentration and the change in the temperature of the processing liquid can be distinguished, whereby a precision similar to that of a case in which the temperature correction is made can be obtained without separately performing the temperature measurement. By this, the chemical processing of the substrate can be carried out more accurately.

Also, it is preferable that a measurement section of the concentration detection means is disposed in a light transmission section of a circulation pipe connected to the processing tank or a branched pipe branched from the circulation pipe. By disposing the measurement section of the concentration detection means in the light transmission section of the circulation pipe or the branched pipe, restriction on the material of the light transmission section and the like can be reduced, and also the reality can be increased from the viewpoint of both of the measurement time difference and the temperature difference as compared with a case in which the sample is bypassed to a cell within a concentration measuring device, whereby the precision of detecting the concentration of the processing liquid circulating within the processing tank can be enhanced more. By this, the chemical processing of the substrate can be carried out more accurately.

At that time, it is preferable that the concentration detection means detects the concentration from which an error fluctuation caused by properties of the light transmission section where the measurement section is disposed has been removed, by measuring the light absorption characteristics at a plurality of wavelengths. When the measurement section is disposed in the light transmission section of the circulation pipe or the branched pipe, restriction on the material of the light transmission section and the like can be reduced; however, even in that case, it is preferable to perform property correction. In particular, by measuring the light absorption characteristics at a plurality of wavelengths, the concentration detection means can accurately detect the concentration of the processing liquid without being affected by the properties of the light transmission section. By this, the chemical processing of the substrate can be carried out more accurately.

When the processing liquid is a phosphoric acid solution containing phosphoric acid as the chemical liquid and water as the diluent, the present invention will be particularly effective because it has been so far considered difficult to perform measurement of the light absorption characteristics using a quartz cell or the like.

MODES FOR CARRYING OUT THE INVENTION

Figure 1:
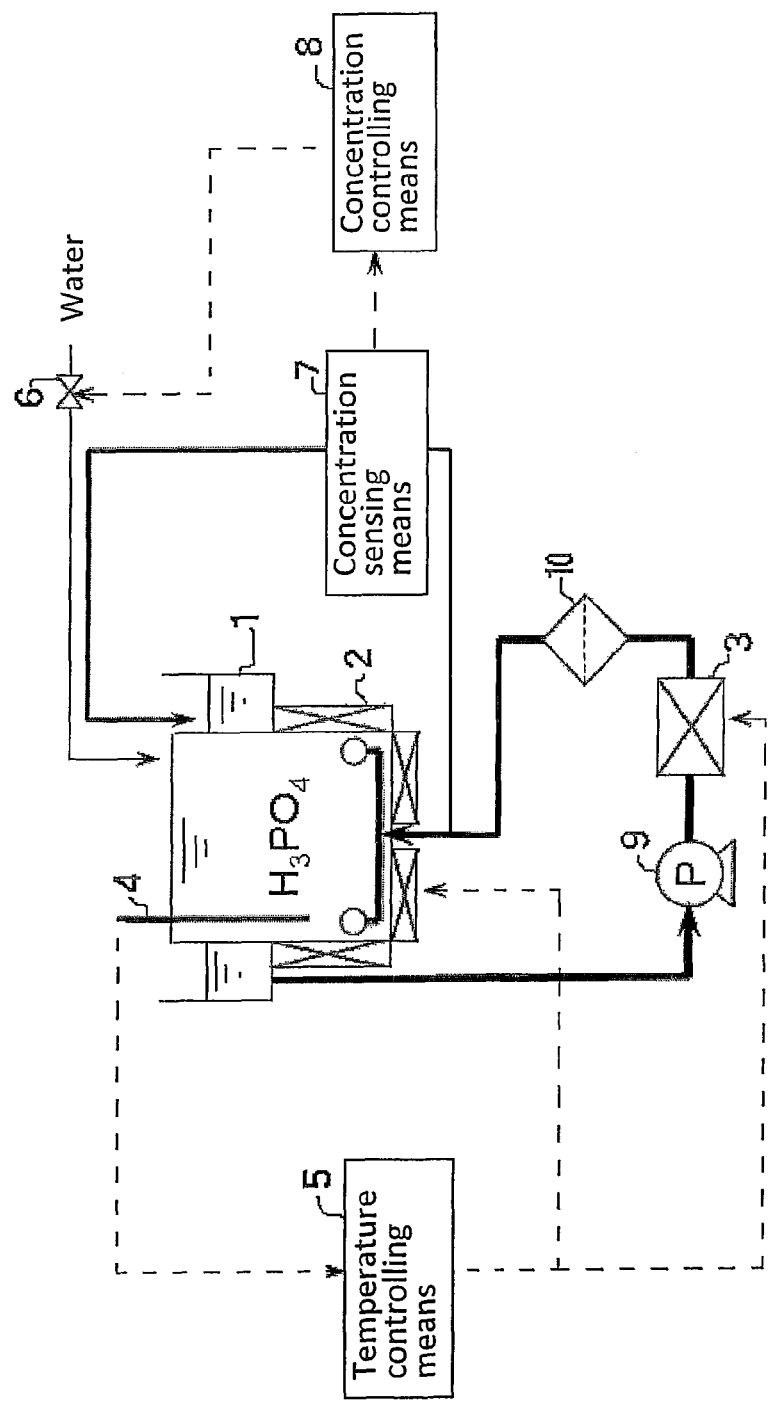
FIG. 1 is a schematic construction view illustrating one example of a substrate processing apparatus of the present invention.

The substrate processing apparatus of the present invention processes a substrate by heating a processing liquid made of a mixture of a chemical liquid and a diluent and immersing the substrate into this processing liquid. In the present embodiment, description will be given by raising, as an example, a case in which the processing liquid is a phosphoric acid solution containing phosphoric acid as the chemical liquid and water as the diluent, and the apparatus performs an etching treatment by immersing the substrate (for example, a silicon wafer for semiconductor) into this phosphoric acid solution while heating this solution.

This substrate processing apparatus includes a processing tank 1 that stores a phosphoric acid solution. A collection tank 1a for collecting the phosphoric acid solution overflowed from the processing tank 1 is provided around this processing tank 1. The phosphoric acid solution collected in the collection tank 1a is returned to the processing tank 1 via a circulation pipe 1b.

This circulation pipe 1b is provided with a circulation pump 9, heating means 3, and a filter 10 and is connected to a jet pipe disposed at the bottom part of the processing tank 1.

The heating means 3 is provided for heating the phosphoric acid solution returned to the processing tank 1, and an electric heater or the like is used therefor. The filter 10 is provided for removing particles from the phosphoric acid solution returned to the processing tank 1. As the filter 10, a porous membrane or the like made of a fluororesin or the like is used.

In the processing tank 1 and the collection tank 1a, heating means 2 for heating the phosphoric acid solution in the tanks is provided, and an electric heater or the like is used therefor. The heating means 3 of the circulation pipe 1b and the heating means 2 for the tanks correspond to the heating means in the present invention.

A top part of the processing tank 1 may be provided with a cover that is freely openable and closable. A plurality of substrates served as an object of processing are held in an upright posture at an equal interval by a holding arm that is freely ascendable and descendable. When the holding arm is outside of the tank, the cover is closed. When a group of substrates are put into the tank while being held by the holding arm, the cover is opened. While an etching treatment is carried out after the group of substrates are put into the tank, the cover is closed again.

The collection tank 1a and the like are provided with a phosphoric acid supplying section (not illustrated in the drawings) for supplying phosphoric acid. Also, the processing tank 1 is provided with a water replenishment section 6a for replenishing with water such as pure water. The water replenishment section 6a is provided with a nozzle disposed in the fringe neighborhood of the processing tank 1, a pipe that connects this nozzle in communication with a water supplying source, and a flow rate regulating valve 6b that intervenes in the pipe. These correspond to the replenishment means in the present invention.

A temperature detection means 4 that detects the temperature of the phosphoric acid solution is disposed in the processing tank 1. As the temperature detection means 4, a temperature sensor using a thermocouple or the like is used. A detection signal obtained by the temperature detection means 4 is sent to temperature controlling means 5. On the basis of this detection signal, the temperature controlling means 5 operates the heating means 2, 3 so that the detected temperature may come close to a set temperature. As the control at that time, a PID (proportion, integration, differentiation) control, an ON/OFF control, or the like can be made. Specifically, the temperature controlling means 5 performs control by operating the heating means 2, 3 so that the temperature of the phosphoric acid solution will be, for example, within a range from 159 to 161° C.

The concentration detection means 7 is for detecting the concentration of the processing liquid by measuring the absorbance characteristics of the processing liquid. The absorbance characteristics can be measured by an intensity value of the light transmitted through the processing liquid or the light reflected from it. Specifically, the concentration of acid in a phosphoric acid solution can be determined by introducing the phosphoric acid solution serving as an object of measurement into the light-transmitting section, allowing light having a different wavelength to be transmitted through or reflected from the light-transmitting section, measuring an intensity value of the transmitted light or reflected light, calculating the absorbance from the intensity value, and using the absorbance and a calibration line formula.

The calibration line formula can be determined as a calibration line formula between the absorbance and the acid concentration in the phosphoric acid solution by introducing a sample of a phosphoric acid solution having a known concentration into a cell or the like for light transmittance or light reflection, allowing light having a different wavelength in an infrared wavelength region to be transmitted through or reflected from the cell or the like, measuring an intensity value of the transmitted light or reflected light, repeating this measurement for a plurality of samples, and calculating the absorbance from the intensity value of the above plurality of samples.

Further, information on the properties specific to the light-transmitting section can be incorporated into the calibration line by preparing the calibration line formula by introducing into the light-transmitting section that is put to use instead of preparing the calibration line formula by using a specific cell. Therefore, the concentration of the processing liquid can be detected continuously without generating time lag or temperature difference by measuring the concentration directly in the circulation path of the processing liquid or the branched path thereof.

In the present invention, the measurement section of the concentration detection means 7 may be disposed at any position where the processing liquid is present; however, the measurement section is preferably disposed at a light transmission section 1*d* of the circulation pipe 1*b* connected to the processing tank 1 or a branched pipe 1*c* branched from the circulation pipe 1*b*. In the present embodiment, an example will be shown in which the measurement section of the concentration detection means 7 is disposed at the light transmission section 1*d* of the branched pipe 1*c* branched from the circulation pipe 1*b*.

Figure 2:
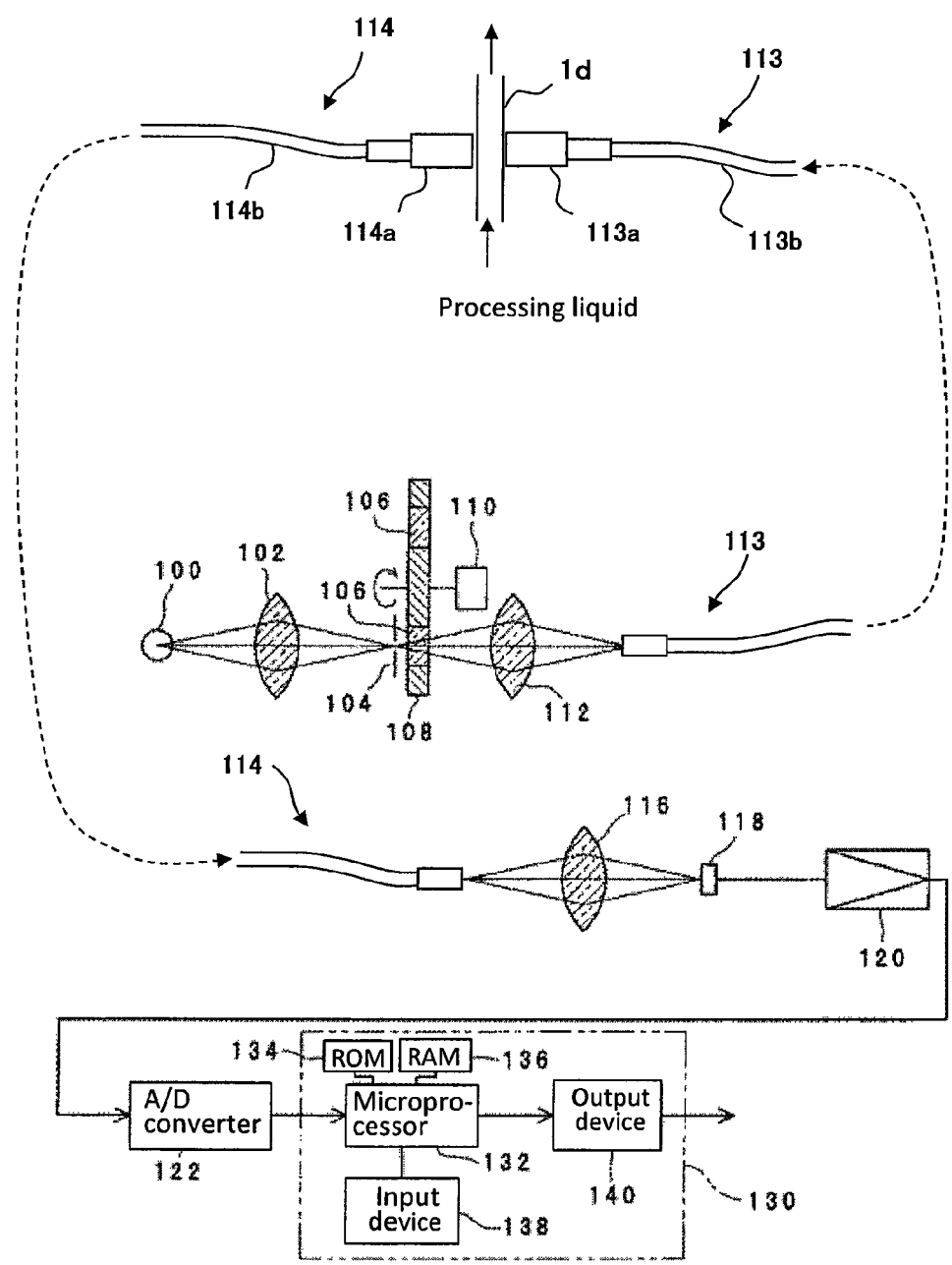
FIG. 2 is a schematic construction view illustrating one example of an essential part of a substrate processing apparatus of the present invention.

Referring to FIG. 2, the concentration detection means 7 includes, for example, the light transmission section 1*d* for light transmission or reflection detection to which the phosphoric acid solution serving as an object of measurement is introduced, a light source 100 that radiates light in an infrared wavelength range, light receiving means that detects light intensities at different wavelengths of the transmitted light or reflected light obtained by radiating the light from the light source 100, storage means that stores a calibration line formula showing a relationship between the concentration of the acid in the phosphoric acid solution and the absorbance, and concentration calculation means that calculates the absorbance from the light intensity signals that are output from the aforementioned light receiving means and determines the concentration of the acid in the phosphoric acid solution based on the above calibration line formula from the above absorbance.

As the light source 100, a lamp 100 such as a tungsten lamp or a halogen lamp that generates infrared light having a wavelength around 800 to 1600 nm is used, and infrared light of 800 to 2000 nm, more preferably 800 to 1600 nm, is used for the measurement. The reason why this wavelength range is used is that the change in the absorption amount relative to the change in the water concentration and the change in the water temperature in the phosphoric acid solution can be measured at a good precision. For example, the absorption band of water around 980 nm is observed as a change in the magnitude of absorption with respect to the change in the water concentration and is observed as a shift of the absorption peak with respect to the change in the water temperature. Therefore, by simultaneously measuring the absorption characteristics at a wavelength around 980 nm and at a wavelength around 1100 nm, the light absorption characteristics by water concentration and the light absorption characteristics by water temperature can be distinguished from each other.

The infrared light radiated from the infrared lamp 100 is condensed by a first convex lens 102 and passes through an aperture 104 and an interference filter 106 disposed at a focal position of the first convex lens 102. A rotary disk 108 holds a plurality of (for example, eight) interference filters 106 at an equal angular interval in the circumferential direction and is rotated and driven at a predetermined rotation number (for example, 1000 rpm) by a driving motor 110. Here, the interference filters 106 disperse the infrared light that has passed through the aperture 104 into infrared light of predetermined wavelengths within the above wavelength range. The infrared light that has been dispersed by the interference filters 106 is condensed by a second convex lens 112 and is guided into an entrance end of an optical fiber 113 for projection.

An infrared spectroscopy apparatus using an optical fiber is disclosed in detail in JP-A-06-11442. The optical fiber 113 for projection includes a projection head 113*a* at an exit side of the optical fiber 113*b*, and the projection head 113*a* has a lens that condenses the light that has exited to be diverged from the exit end of the optical fiber 113*b*. Also, an optical fiber 114 for photoreception includes a photoreception head 114*a* at an entrance side of an optical fiber 114*b*, and the photoreception head 114*a* has a lens that condenses the light to an entrance end of the optical fiber 114*b*. The degree of condensation by the two lenses is determined by the area of light radiation into the processing liquid serving as an object of measurement.

The light transmission section 1*d* may be a flowcell connected to a pipe; however, a light-transmitting pipe may also be used as it is. Quartz that is generally used as a material of a cell is liable to be etched when the processing liquid is phosphoric acid, or a silicon compound dissolved in the processing liquid is liable to adhere thereto to generate haze. Therefore, in the present invention, it is preferable to use a pipe made of a light-transmitting resin. As the light-transmitting resin constituting such a pipe, a fluororesin such as PFA is preferable in view of chemical resistance, heat resistance, and adherence of silicon compounds. When a pipe made of a light-transmitting resin is used as the light transmission section 1*d*, the degree of condensation by the lenses of the projection head 113*a* and the photoreception head 114*a* is preferably a diameter of about half of the diameter of the pipe that will be the cell.

In the present invention, concentration measurement can be carried out continuously in line by using a flowcell or a pipe as the light transmission section 1*d*. Part of the infrared light that has been radiated to the light transmission section 1*d* is absorbed by the phosphoric acid solution, and the rest is transmitted through the light transmission section 1*d*. The infrared light that has been transmitted through the light transmission section 1*d* and guided into the optical fiber 114 for photoreception is guided out from an exit end of the optical fiber 114 for photoreception. The light that has been guided out is condensed by a third convex lens 116 to be incident into a light-receiving element 118.

When the rotary circular disk 108 is rotated and driven by the driving motor 110, the light-receiving element 118 generates a signal that is proportional to the degree of transmittance, corresponding to the phosphoric acid solution, of each infrared light corresponding to the transmittance wavelength of a plurality of interference filters 106 that are held by the rotary circular disk 108. The light-receiving element 118 converts the incident infrared light into a photocurrent corresponding to the intensity thereof.

The interference filters 106 that are held by the rotary circular disk 108 respectively have transmission wavelengths that are different from each other in accordance with the object of measurement. When the rotary circular disk 108 rotates, each of the interference filters 106 is sequentially inserted into the optical axes of the first convex lens 102 and the second convex lens 112. Then, after being dispersed by the interference filters 106, the infrared light radiated from the infrared lamp 100 is transmitted through a sample in the light-transmitting section 151 (part thereof is absorbed) and is condensed by the third convex lens 116 to be incident into the light-receiving element 118.

By this, the light-receiving element 118 outputs an electric signal corresponding to the light intensity of the infrared light of each wavelength. An amplifier 120 amplifies a transmitted light intensity signal of the light-transmitting section 151 that has been output from the light-receiving element 118. An A/D converter 122 converts an analog signal that has been output from the amplifier 120 into a digital signal.

Next, a concrete construction of a data processing section 130 will be described. The data processing section 130 receives the transmitted light intensity signal which is a digital signal from the A/D converter 122 and calculates the absorbance of the infrared light of each wavelength therefrom. Then, the concentration of water or phosphoric acid in the phosphoric acid solution is calculated on the basis of the calculated absorbance of the infrared light of each wavelength and the calibration line formula that is stored beforehand.

The calibration line formula is determined in advance by measuring the absorbance of the light of a plurality of wavelengths on a plurality of samples having a known concentration and using a multiple-order polynomial of the absorbance including a constant term between the absorbance and the concentration of each component by the multiple variable analysis method, and is stored in a storage device (RAM 136).

After being amplified by the amplifier 120, each of the signals generated by the light-receiving element 118 is converted into a digital signal by the A/D converter 122, and input into a microprocessor 132 of the data processing section 130. The data processing section 130 may be, for example, a personal computer having a microprocessor 132. The microprocessor 132 is connected to a ROM 134 that stores programs and the like, a RAM 136 serving as a work area, an input device 138 such as a keyboard or a mouse for inputting data and various commands, an output device 140 for outputting a signal to the outside, and the like. The ROM 134 stores a program or the like for operating the microprocessor 132. The RAM 136 stores the calibration line formula and various data. The microprocessor 132 calculates the absorbance at each wavelength from the input digital signal, and calculates the concentration of the phosphoric acid solution from the calculated absorbance of the light of each wavelength using the calibration line formula. The output device 140 may be a printer, a display, a data-outputting interface, or the like that outputs a result of data processing.

Figure 4:
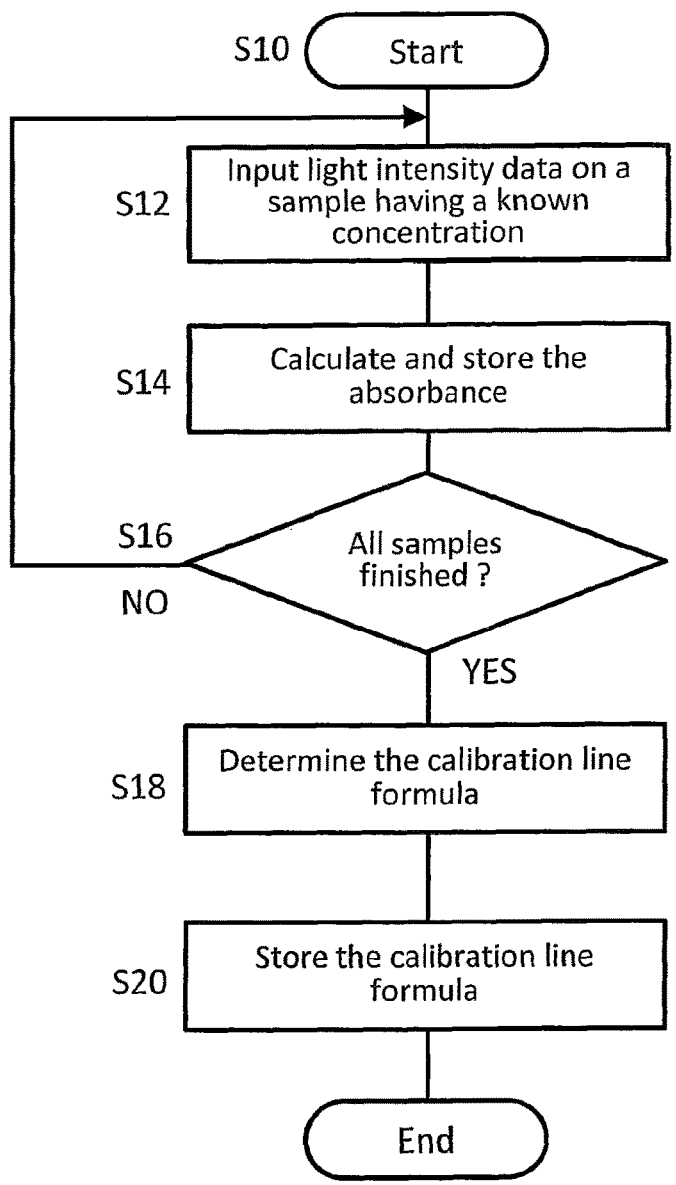
FIG. 4 is a flowchart of data processing by a microprocessor.
Figure 5:
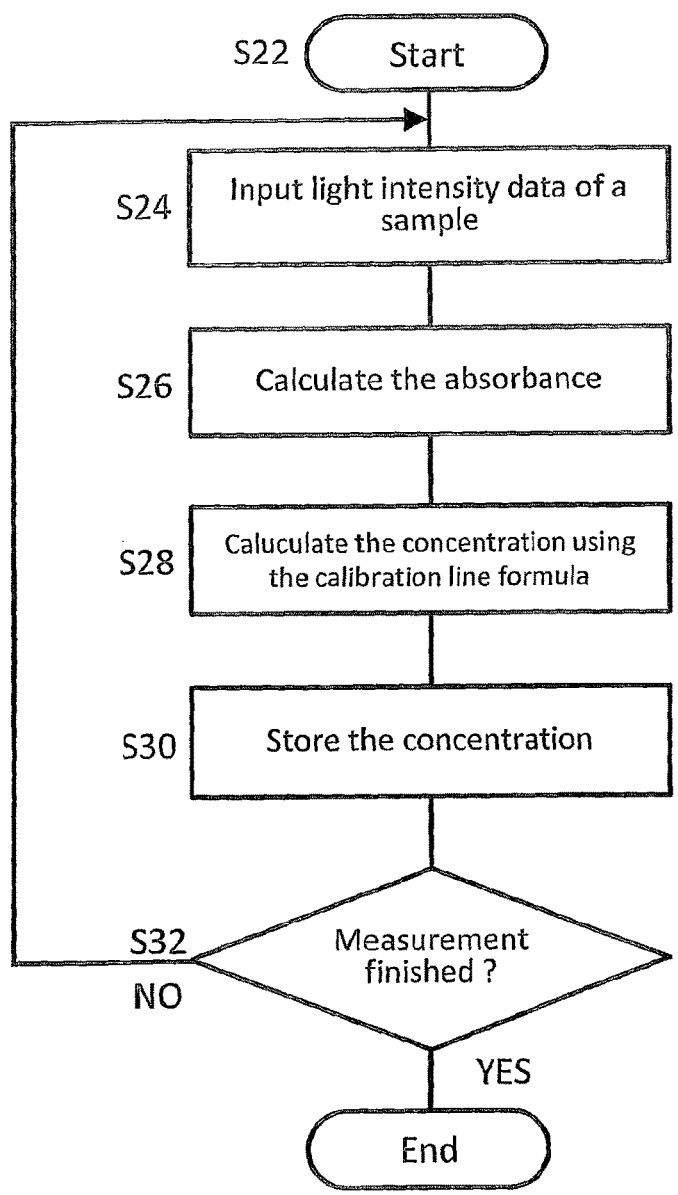
FIG. 5 is a flowchart of data processing by a microprocessor.

FIGS. 4 and 5 show a flow of processing by the microprocessor 132. First, when measurement of a sample having a known concentration is started (S10), light intensity data at a plurality of wavelengths are input from the A/D converter 122 of the optical measurement system in synchronization with the rotation of the rotary circular disk 108 (S12). Then, the absorbance is calculated from the light intensity data and stored (S14). When there is a next sample having a known concentration (YES in S16), the above-described processing is repeated. When there is no next sample having a known concentration (NO in S16), a calibration line formula between the absorbance and the concentration is calculated (S18), and stored in the RAM 136 (S20).

When measurement of a sample having an unknown concentration is started (S22), light intensity data at a plurality of wavelengths are input from the A/D converter 122 of the optical measurement system in synchronization with the rotation of the rotary circular disk 108 (S24). Then, the absorbance is calculated from the light intensity data (S26). Then, the concentration is calculated from the absorbance and the calibration line formula (S28), and stored in the RAM 136 (S30). Here, whether the measurement is ended or not is determined (S32). When the measurement is not ended, the procedure returns to the step S24, and the concentration measurement is continued.

The technique of processing the light intensity data in the processing by the microprocessor 132 shown in FIG. 4 is similar to the one disclosed in JP-A-06-265471 filed by the present applicant and used in spectroscopy measurement in the near infrared wavelength region. Concrete contents of the data processing will be described below.

First, calculation processing by the next formula (1) is carried out on the input digital signal of the light intensity, so as to calculate the absorbance Ai.

$$A_i = -\log_{10}(R_i - D_i)/(B_i - D_i)$$ [Formula 1]

In this formula, i is the order or number (for example, 1 to 8) of the plurality of dispersed infrared wavelengths; $R_i$ is the transmittance intensity value of the infrared light of the i-th wavelength of the phosphoric acid solution serving as an object of measurement; $B_i$ is the transmittance intensity value of the infrared light of the i-th wavelength of the phosphoric acid solution having a standard concentration that has been introduced into the light-transmitting section 151; and $D_i$ is the transmittance intensity value of the infrared light of the i-th wavelength when the light-transmitting section 151 is shielded against light. Here, $B_i$ and $D_i$ are data measured in advance and are stored in the RAM 136 of the data processing apparatus.

Next, conversion of the following formula (2) is carried out on the absorbance $A_i$ obtained by the calculation process of the formula (1).

$$S_i = A_i - A_{i+1}$$ [Formula 2]

The reason why the conversion of the formula (2) is carried out is as follows. The absorbance $A_i$ calculated by the formula (1) undergoes change in accordance with the fluctuation of the light emission intensity of the infrared lamp 100, the sensitivity fluctuation of the light-receiving element 118, and the strain of the optical system. However, this change does not have much wavelength dependency, and is superposed with the same phase and at the same level on each of the absorbance data on the infrared light of each wavelength. Therefore, by taking a difference between the wavelengths as shown in the formula (2), this change can be cancelled.

The absorbance Ai may fluctuate by refractive index fluctuation or increase in the turbidity in accordance with the temperature fluctuation or deterioration of the phosphoric acid solution itself; however, these fluctuations can be removed by a known method. In the present invention, it is preferable that the concentration detection means 7 performs temperature correction of the detected concentration on the basis of the temperature of the processing liquid. In particular, it is preferable that the concentration detection means 7 detects the concentration from which the error fluctuation caused by the temperature of the processing liquid is removed by measuring the absorbance characteristics at a plurality of wavelengths. Information on the temperature in performing the temperature correction is not separately needed when reflected on the calibration line formula. However, separate temperature detection means may be provided near the measurement section of the concentration detection means 7 or the like place, and the temperature correction can be made by using this.

A method of performing temperature correction in the concentration measurement by absorbance is disclosed in detail in JP-A-03-209149 and others. For example, it is possible to use a spectroscopy measurement method in which the error fluctuations caused by concentration are removed by using an apparatus that performs spectroscopy measurement at a plurality of predetermined wavelengths, determining for each wavelength the data of output fluctuations of spectroscopy measurement data with respect to the error fluctuation causes per unit for each of the temperatures, assuming these output fluctuation data as vectors in a space having a dimension of the number of measurement wavelengths, determining a subspace that is orthogonal to all the vectors, performing spectroscopy measurement for each wavelength of a plurality of samples in which the concentration of the measurement object is known in advance, converting these optical measurement data into data that are projected to the above subspace, and determining a calibration line formula representing a correlationship between the projected data and the concentration.

Next, on the basis of $S_i$ obtained by the formula (2), calculation of the following formula (3) is carried out for the water in the phosphoric acid solution, so as to calculate the content (concentration) $C_1$ of water.

$$C_1 = F(S_i) \quad \text{[numerical formula 3]}$$

In the formula (3), $F(S_i)$ is a calibration line formula of water, which includes a first-order term and higher-order terms of $S_i$ and also cross terms which are a product of $S_i$ and $S_{i+1}$ or higher-order terms thereof as well as a constant term, and is represented, for example, by the following formula (4).

$$C_1 = \Sigma \alpha_i S_i + \Sigma \beta_i S_i^2 + \Sigma \gamma_i S_i S_{i+1} + \ldots + Z_0 \quad \text{[numerical formula 4]}$$

In the formula (4), $S_i$ and $S_{i+1}$ are data obtained by the formulas (1) and (2); α, β, and γ are coefficients of the calibration line formula; and $Z_0$ is a constant term. Each of the data contained in the formula (4) is determined in advance by the measurement using standard samples of phosphoric acid solution in which the concentration of phosphoric acid (that is, the concentration of water) is already known, and is stored in a RAM 136 of a data processing section 130. Therefore, by measuring an intensity value of each wavelength of the phosphoric acid solution serving as an object of measurement, the content (concentration) $C_1$ of water can be calculated.

In the present invention, the concentration detection means 7 or the concentration control means 8 preferably performs property correction of the detected concentration on the basis of the properties (material, thickness, width, and the like) of the light transmission section 1d where the measurement section is disposed. In particular, it is preferable that the concentration detection means 7 measures the light absorption characteristics at a plurality of wavelengths, thereby to detect a concentration from which the error fluctuation caused by the properties of the light transmission section 1d where the measurement section is disposed is removed. In the case of performing such removal of the error fluctuation caused by the properties, the method disclosed in JP-A-03-209149 can be used in the same manner as in a case of performing removal of the error fluctuation caused by temperature.

The signal on the detected concentration of the phosphoric acid solution obtained in the concentration detection means 7 is sent to the concentration controlling means 8. The concentration controlling means 8 adjusts the amount of replenishment with water by operating the flow rate adjustment valve 6b of the replenishment means 6 so that the concentration detected by the concentration detection means 7 may come close to the set concentration. Specifically, the concentration controlling means 8 operates the flow rate adjustment valve 6b by the PID (proportion, integration, differentiation) control on the basis of the detected concentration of the phosphoric acid solution. For example, control is made in such a manner that, when the detected concentration of the processing liquid is above the set concentration, replenishment with the diluent is made, whereas when the detected concentration of the processing liquid is below the set concentration, replenishment with the diluent is stopped.

In the present invention, a main controlling section for managing the whole of the substrate processing apparatus may be provided. Specifically, the main controlling section can give a command of the set temperature of the phosphoric acid solution to the temperature controlling means 5, a command of a target concentration of the phosphoric acid solution to the concentration controlling means 8, a command for operating the flow rate adjustment valve for adjusting the flow rate of phosphoric acid, and the like.

Next, an operation of the substrate processing apparatus will be described. First, the flow rate adjustment valve for adjusting the flow rate of phosphoric acid is opened, whereby the phosphoric acid is supplied to the collection tank 1a. The phosphoric acid supplied to the collection tank 1a is heated by the heating means 3 while being sent to the processing tank 1 via the circulation pipe 1b, and the phosphoric acid introduced into the processing tank 1 is heated also by the heating means 2.

The temperature of the phosphoric acid in the processing tank 1 is detected by the temperature detection means 4, and a signal thereof is sent to the temperature controlling means 5. The temperature controlling means 5 performs temperature management, for example, within a range of ±1° C. relative to the set temperature of 160° C. Specifically, when the liquid temperature is lower than 159° C., heating by the heating means 2, 3 is continued. When the temperature exceeds 161° C., heating by the heating means 2, 3 is stopped, and the liquid temperature is lowered by natural cooling.

The concentration of the processing liquid guided from within the processing tank 1 to the circulation pipe 1b and the branched pipe 1c is sequentially detected by the concentration detection means 7. The concentration controlling means 8 replenishes the processing tank 1 with water by operating the flow rate adjustment valve 6b by PID control or the like so that this detected concentration may come close to a target concentration that is set in advance. This target concentration is set to be a little higher than the boiling point concentration corresponding to the set temperature of the phosphoric acid solution or to be a concentration higher than that concentration.

When the detected concentration of the phosphoric acid solution in the processing tank 1 exceeds the target concentration range, replenishment with water is continued. When the detected concentration is lower than the target concentration range, replenishment with water is stopped. When replenishment with water is stopped, water in the phosphoric acid solution is evaporated by heating of the phosphoric acid solution, whereby the concentration of the phosphoric acid solution naturally rises.

When the phosphoric acid solution in the processing tank 1 comes into the target concentration range and is stabilized, the group of substrates held by the holding arm is put into the processing tank 1, and an etching treatment of the group of substrates is started. The temperature control and the concentration control are repeatedly carried out until a predetermined processing time passes. When the processing time passes, the group of substrates are pulled up from within the tank and transported to the next processing tank.

Figure 3:
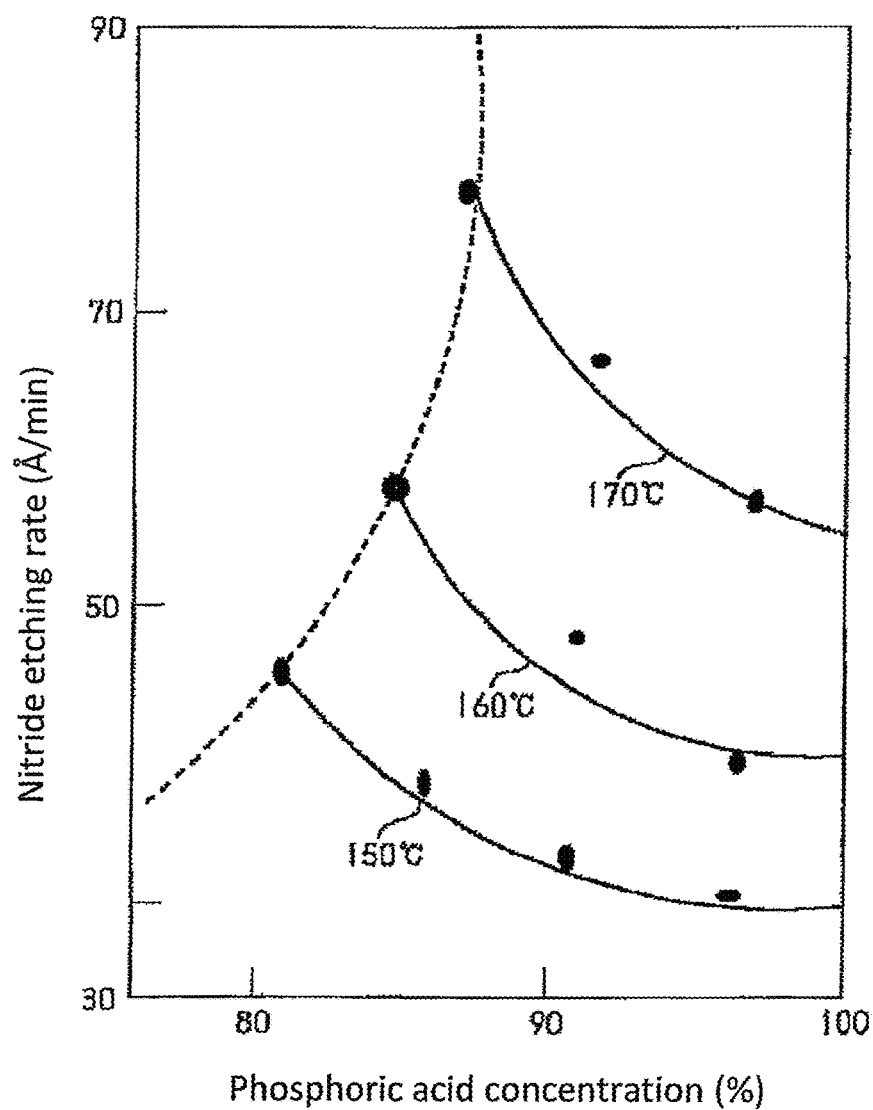
FIG. 3 is a graph depicting a relationship between the concentration and temperature of a phosphoric acid solution and the silicon nitride film etching rate.

Next, a relationship between the temperature control and the concentration control of the phosphoric acid solution in the present invention will be described with reference to FIG. 3. FIG. 3 is a graph depicting a relationship between the concentration and temperature of the phosphoric acid solution and the silicon nitride film etching rate. In this Figure, the etching rate at each temperature is shown in a solid line as an etching rate curve, and the boiling point that changes by concentration change is shown in a broken line as a boiling point curve. As shown in this Figure, the boiling point of the phosphoric acid solution has a property of rising according as the concentration of the phosphoric acid solution rises.

Also, in the present invention, the temperature controlling means 5 performs control so as to maintain the temperature of the phosphoric acid solution to be constant. Therefore, the silicon nitride film etching rate moves along the etching rate curve for each temperature in accordance with a fluctuation of the concentration. Here, cases with a temperature of 150° C., a temperature of 160° C., and a temperature of 170° C. are shown. In the previous control, the set temperature of the phosphoric acid solution is 160° C., so that the etching rate can be changed along the corresponding curve by changing the set value of concentration.

At that time, bumping of the phosphoric acid solution by replenishment with water can be prevented in advance by raising the set value of the concentration of the phosphoric acid solution to be higher than the boiling point at the set temperature. Also, for a technique of etching a silicon oxide film simultaneously with a silicon nitride film, the etching selectivity ratio of silicon nitride and silicon oxide film can be freely controlled.

[Other Embodiments]

The present invention is not limited to the above-described embodiments alone, so that the embodiments can be modified in the following manner.

(1) In the aforesaid embodiments, an example has been shown in which a phosphoric acid solution is used as the processing liquid. However, in the present invention, it is possible to use a different processing liquid such as mixed acid solution (sulfuric acid+hydrogen peroxide), sulfuric acid solution, or hydrofluoric acid solution. An apparatus for measuring the concentration of mixed acid using the light absorption characteristics is disclosed in detail in JP-A-06-265471.

(2) In the aforesaid embodiments, an example has been shown in which the measurement section of the concentration detection means is disposed in the light transmission section of the branched pipe branched from the circulation pipe connected to the processing tank; however, the measurement section may be disposed by providing a light transmission section in the circulation pipe connected to the processing tank. Also, by providing a window section in the processing tank, the measurement section of the concentration detection means may be disposed to measure the light absorption characteristics. Also, by providing a measurement probe disclosed in JP-A-2000-88749 or the like in the processing tank, the measurement section of the concentration detection means may be disposed to measure the light absorption characteristics.

(3) In the aforesaid embodiments, an example has been shown in which the measurement section of the concentration detection means is disposed at a position located away from the optical system of the concentration detection means by using an optical fiber for projection and an optical fiber for photoreception; however, the optical system may be disposed near the light transmission section of the pipe.

(4) In the aforesaid embodiments, an example has been shown in which the concentration detection means measures the detected concentration without being affected by the temperature of the processing liquid by using a calibration line formula that reflects the temperature information; however, the concentration control means may perform temperature correction of the detected concentration on the basis of the temperature of the processing liquid. In that case, for example, a table that records a correction value with respect to the detected concentration at each temperature may be stored beforehand, and calculation that calculates a correction value on the basis of the detected temperature may be carried out using the table. Also, the correction value of the detected concentration at the detected temperature may be calculated using a function for correction that has been prepared in advance.

(5) In the aforesaid embodiments, an example has been shown in which the concentration detection means performs property correction of the detected concentration on the basis of the properties of the light transmission section where the measurement section is disposed; however, the concentration control means may perform property correction of the detected concentration on the basis of the properties of the light transmission section. In that case, for example, a table that records a correction value with respect to the detected concentration for each material (material, thickness, and the like) may be stored beforehand, and calculation that calculates a correction value on the basis of the properties may be carried out using the table. Also, the correction value of the detected concentration for each property may be calculated using a function for correction that has been prepared in advance.

(6) In the aforesaid embodiments, an example has been shown in which the temperature detection means is implemented by a temperature sensor using a thermocouple; however, the light absorption characteristics of the processing liquid may be used as the temperature detection means. In that case, temperature detection means that detects the temperature of the processing liquid by measuring the light absorption characteristics of the processing liquid may be separately provided; however, it is preferable that the concentration detection means also serves as the temperature detection means. In that case, the absorbance of the processing liquid of a known concentration but having a different temperature may be measured and added to the calibration line in advance, so as to calculate both of the concentration and the temperature of the processing liquid.

DESCRIPTION OF REFERENCE SIGNS

1 processing tank
1b circulation pipe
1d light transmission section
2 heater (heating means)
3 heater (heating means)
4 temperature detection means
5 temperature control means
6 replenishing means
7 concentration detection means
8 concentration control means
9 circulation pump
10 filter

The invention claimed is:

1. A substrate processing apparatus that processes a substrate by heating a processing liquid containing phosphoric acid as a chemical liquid and water as a diluent and immersing the substrate into this processing liquid, comprising:
   the processing liquid comprising the phosphoric acid and the water;
   a processing tank adapted to store the processing liquid;
   a heater that heats the processing liquid;

a thermometer that detects the temperature of the processing liquid;

a thermostat that operates said heater in a manner so that the temperature detected by the thermometer approaches a set temperature;

a supply that replenishes the processing liquid with the diluent;

optics that detect the concentration of the processing liquid from which an error fluctuation caused by the temperature of the processing liquid has been removed, by measuring light absorption characteristics of the processing liquid comprising the phosphoric acid and the water, said optics set to measure the light absorption characteristics at a wavelength around 980 nm and at a wavelength around 1100 nm;

a microprocessor configured to carry out calculation of a concentration of the water by carrying out a calculation of concentration $C_1$ of water using the equation: $C_1=F(S_i)$ wherein $F(S_i)$ is a calibration line formula of water obtained by measuring the light absorption characteristics of a plurality of wavelengths on a plurality of samples having a known concentration of water using the measured light absorption characteristics at a wavelength around 980 nm and at a wavelength around 1100 nm; and a controller that operates said supply in a manner so that the concentration detected by the optics approaches a set concentration.

2. The substrate processing apparatus according to claim 1, wherein a measurement section of said optics are disposed in a light transmission section of a circulation pipe connected to said processing tank or a branched pipe branched from the circulation pipe.

3. The substrate processing apparatus according to claim 2, wherein said optics detect the concentration from which an error fluctuation caused by properties of the light transmission section where said measurement section is disposed has been removed, by measuring the light absorption characteristics at a plurality of wavelengths.

4. The substrate processing apparatus according to claim 1 further comprising:

a collection tank disposed around the processing tank for collecting the processing liquid overflowed, and a circulation pipe, through which the processing liquid collected in the collection tank is returned to the processing tank, wherein the optics are disposed at the circulation pipe or a branched pipe branched from the circulation pipe;

a memory storing the predetermined calibration line formula obtained by measuring the light absorption characteristics of a plurality of wavelengths on a plurality of samples having a known concentration of water.

* * * * *